United States Patent
Sugawara

(10) Patent No.: US 6,924,996 B2
(45) Date of Patent: Aug. 2, 2005

(54) EXTERNAL STORAGE DEVICE WHICH IS REPLACEABLE OR PORTABLE AS AN EXERNAL STORAGE MEDIUM FOR A PERSONAL COMPUTER OF THE LIKE

(75) Inventor: Norio Sugawara, Tochigi (JP)

(73) Assignee: Sony Corporation, Tokyo (JP)

( * ) Notice: Subject to any disclaimer, the term of this patent is extended or adjusted under 35 U.S.C. 154(b) by 246 days.

(21) Appl. No.: 10/292,061

(22) Filed: Nov. 12, 2002

(65) Prior Publication Data

US 2003/0137859 A1 Jul. 24, 2003

(30) Foreign Application Priority Data

Jan. 19, 2002 (JP) ........................................ 2002-047165
Jun. 27, 2002 (JP) ........................................ 2002-187534

(51) Int. Cl.[7] ................................................ G11C 5/02
(52) U.S. Cl. ............................ 365/51; 365/63; 361/727
(58) Field of Search ....................... 365/63, 51; 361/727

(56) References Cited

U.S. PATENT DOCUMENTS

| | | | |
|---|---|---|---|
| 6,614,708 B1 * | 9/2003 | Lin et al. ..................... | 365/228 |
| 6,707,748 B2 * | 3/2004 | Lin et al. ..................... | 365/228 |
| 2004/0090751 A1 * | 5/2004 | Choi et al. ................... | 361/726 |
| 2004/0145878 A1 * | 7/2004 | Wang ........................... | 361/785 |

FOREIGN PATENT DOCUMENTS

| | | |
|---|---|---|
| EP | 1 100 000 | 5/2001 |
| JP | 3085361 | 4/1991 |
| JP | 3086525 | 4/1991 |
| JP | 2000-163550 A | 6/2000 |
| JP | 2001-5943 A | 1/2001 |
| JP | 2001-216099 A | 8/2001 |
| JP | 2001-266538 A | 9/2001 |
| JP | 3085361 U | 2/2002 |
| JP | 3086525 U | 3/2002 |
| WO | WO 01 61692 | 8/2001 |

* cited by examiner

Primary Examiner—Van Thu Nguyen
Assistant Examiner—Tuan T. Nguyen
(74) Attorney, Agent, or Firm—Frommer Lawrence & Haug LLP; William S. Frommer

(57) ABSTRACT

[Problem]

An external storage device is provided, which can call attention to the handling as precision electronic equipment so as to obtain an appropriate attachment action for a cap while preventing the cap from easily coming off.

[Means of Solving the Problem]

A substrate holder 13 is made of a transparent material. At the same time, notches 19A and 20A for externally exposing the substrate holder 13 are formed in a main body 11 and a cap 14, respectively. A memory substrate 12 present inside can be visibly observed from the exterior through these notches 19A and 20A and the transparent substrate holder 13. Moreover, a pair of guide edges 28 and 29 are formed so that the notches 19A and 20A are parallel in an attachment/removal direction of the cap 14 and to oppose to each other, whereas guide parts 30 and 30 in sliding contact with the guide edges 28 and 29 along their total length are provided for the substrate holder 13 so as to guide the attachment/removal of the cap 14.

7 Claims, 15 Drawing Sheets

EXTERNAL STORAGE DEVICE WHICH IS REPLACEABLE OR PORTABLE AS AN EXERNAL STORAGE MEDIUM FOR A PERSONAL COMPUTER OF THE LIKE

BACKGROUND OF THE INVENTION

Detailed Description of the Invention

1. Technical Field of the Invention

The present invention relates to an external storage device which is replaceable or portable as an external storage medium for a personal computer or the like.

2. Related Art

Conventionally, as storage devices or storage elements which are capable of recording and storing various data or sounds/images, there are built-in storage devices or elements fixed within a main body of equipment such as a personal computer and those which are arbitrarily attachable and removable (or replaceable) to/from a main body of equipment.

For example, in a case of a flexible disk device as an external storage device which is freely attachable/removable to/from a main body of equipment, there are great advantages in that such a device can be attached/removed through one-touch operation and the arrangement of data and the like is easily effected because it can record and store the data and the like differently in accordance with the purpose and the object.

In the case of the flexible disk, however, in the recording and storage of data and the like it has inconveniences not only in that it is insufficient in view of the reliability but also in that the access time is slow. Moreover, if it is compacted in accordance with the tendency of light-weight and reduced thickness and size, the area of a recording medium is necessarily reduced, resulting in reduction in storage capacitance. Therefore, there is a limit in reduction in size and increase in capacitance.

On the other hand, in a case where a semiconductor memory is used as an external storage device, there is an advantage in that the problems of the flexible disk, that is, the problem in the reliability of recording and storage of data and the like and the problem of slow access time, can be solved.

As a conventional external storage device using a semiconductor memory, for example, a card-type external storage device as disclosed in Japanese Patent Application Publication Hei 6-312593 and the like is widely known. However, such a card-type external storage device lacks in general-purpose properties of a driver device for performing reading/writing of the external storage device. Therefore, such a card-type external storage device is not user-friendly.

Therefore, an external storage device, which is used under such a form that is inserted into a USB (Universal Serial Bus) port of a personal computer and the like, has been recently proposed. This external storage device does not require any dedicated driver device. Since its mere insertion into a USB port, which is generally provided for a personal computer, allows the storage and readout of data, it has enhanced convenience. FIGS. 16A and 16B show an example of this type of a conventional external storage device.

A conventional storage device 1 houses a memory substrate, on which a semiconductor memory is mounted, inside a main body 2 made of a resin. An external connection terminal 3 such as a connector attached to an edge on one end of the memory substrate is exposed outwardly beyond the main body 2.

Then, in use, the external connection terminal 3 is connected to a USB port and the like of a not-shown personal computer, so that information recorded in the semiconductor memory is read out or information is recorded in the semiconductor memory. When the external storage device is not used, a cap 4 is attached to the main body 2, so that the external connection terminal 3 is protected against adhesion of dusts and the like to ensure the accurate readout and recording/storage of information.

[Problems to be Solved by the Invention]

In the above-described conventional external storage device 1 using a semiconductor memory, the memory substrate, on which electronic parts such as a semiconductor memory are mounted, is housed inside the main body 2 made of an opaque resin material. Therefore, an internal structure of the external storage device 1, which is precision electronic equipment, is put into an invisible state to a user. Thus, there is a problem in that its internal structure is unlikely to call user's attention to attentive handling, leading to, for example, storage under a circumstance subject to high temperature and high humidity which is not preferable for the precision electronic equipment, application of a strong shock, and the like.

Furthermore, in the above-described conventional external storage device 1, an engaging portion 5 for creating an engagement force upon attachment of the cap 4 to the main body 2 is provided so as to provide a certain locking function of the cap 4, with the intention of integrating the main body 2 and the cap 4 with each other.

In this structure, however, a contact area between the main body 2 and the cap 4 is ensured only in the vicinity of the engaging portion 5 when the cap 4 is attached. Therefore, when a shock is carelessly applied to the cap 4 to cancel the engagement relation at the engaging portion 5, there arises a problem in that the cap 4 is extremely easily removed from the main body 2.

Moreover, it is difficult to make a user surely recognize the state where the attachment operation of the cap 4 by the user is incomplete. Furthermore, if this incomplete state is left as it is, the cap 4 is removed from the main body 2 before the user notices it, and at worst, the cap 4 is lost.

SUMMARY OF THE INVENTION

The present invention is devised in view of the above-described problems, and has an object of providing an external storage device, which allows a user to obtain an outer shape calling attention to the handling as precision electronic equipment.

Moreover, the present invention has an object of providing an external storage device which prevents a cap for protecting an external connection terminal of a memory substrate from being easily removed and allows an appropriate attachment state of the cap to be easily obtained.

[Means for Solving the Problems]

In order to solve the above problems, an external storage device of the present invention is characterized by comprising: a main body; a memory substrate on which at least a semiconductor memory is mounted, the memory substrate being provided with an external connection terminal on an edge of its one end; a substrate holder including a substrate insertion hole therein through which the memory substrate is inserted, the substrate holder being for fixing the memory substrate to the main body while the external connection terminal is being outwardly projected beyond an opening on one end of the substrate insertion hole; and a cap for protecting the external connection terminal, the cap being attachable/removable to/from the substrate holder, wherein the substrate holder is made of a transparent material; at least one notch for externally exposing the substrate holder is formed in the main body and/or the cap; and the memory substrate is visibly observable from exterior through the notch and the transparent substrate holder.

According to the present invention, since the substrate holder is made of a transparent material, a region of the substrate holder exposed through the notch formed in the main body and/or the cap functions as a window portion allowing the memory substrate present inside to be visibly observed. As a result, it is possible to call user's attention to the handling as precision electronic equipment.

Moreover, the present invention is characterized in that: the notch formed in the cap includes a pair of guide edges, the guide edges being parallel in an attachment/removal direction of the cap to the substrate holder so as to be opposed to each other; and the substrate holder is provided with rectilinear guide parts in sliding contact with the pair of guide edges over their almost total length so as to guide attachment/removal of the cap.

As a result, in attachment/removal operations of the cap to/from the side of the main body (substrate holder), a rectilinear sliding operation along the guide edges is caused concomitantly therewith so as to make the attachment of the cap more appropriate. At the same time, even if a shock is carelessly applied to the cap in the state where the cap is attached, the cap is prevented from being easily removed from the main body.

DESCRIPTION OF THE PREFERRED EMBODIMENTS

[Embodiments of the Invention]

Figure 1:
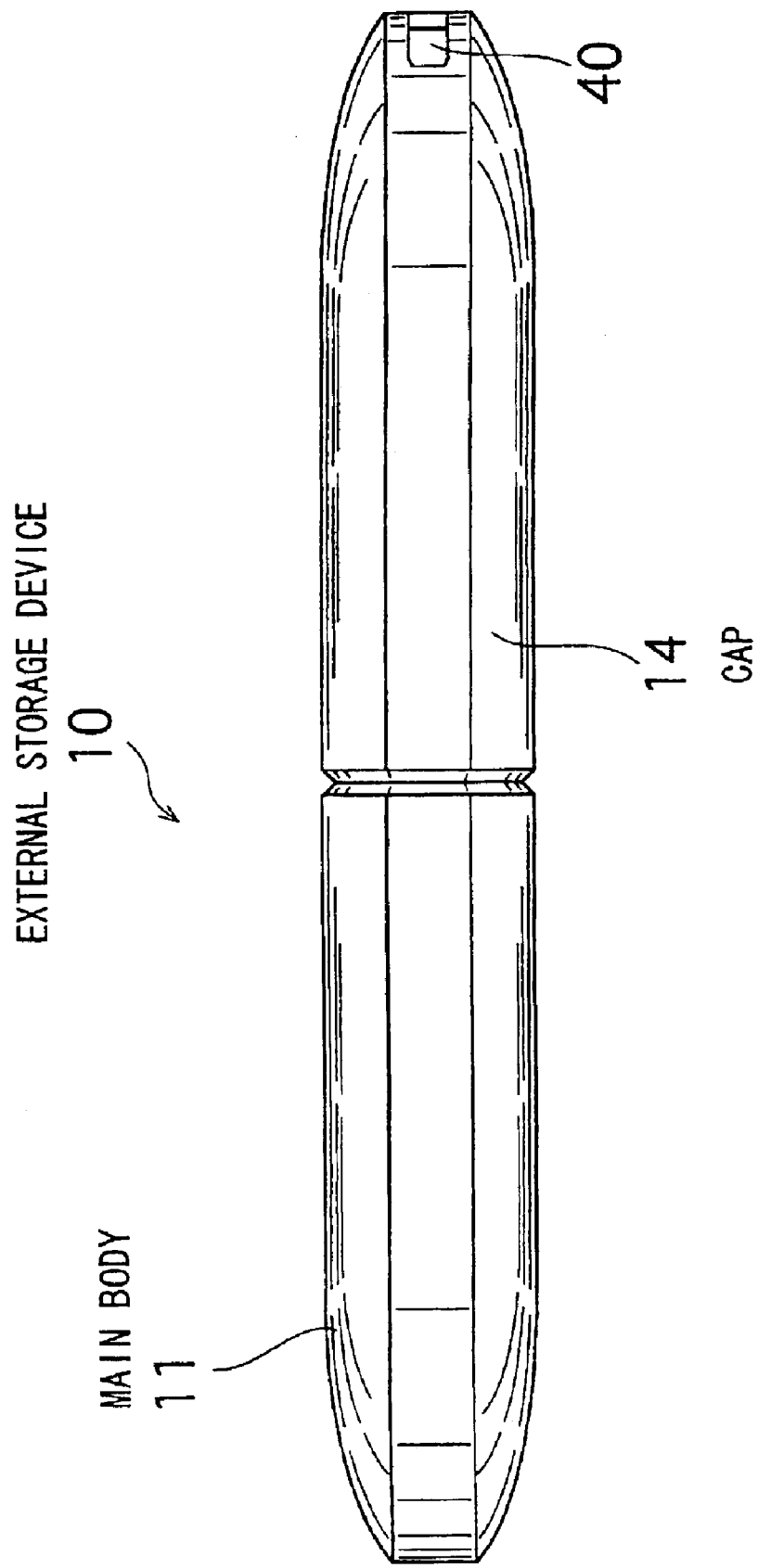
FIG. 1 a side view showing the entire external storage device according to an embodiment of the present invention.

Hereinafter, embodiments of the present invention will be described with reference to the drawings.

FIGS. 1 to 15 show an external storage device according to an embodiment of the present invention. An external storage device 10 of the present embodiment mainly comprises: a main body 11; a memory substrate 12; a substrate holder 13; and a cap 14.

Figure 2:
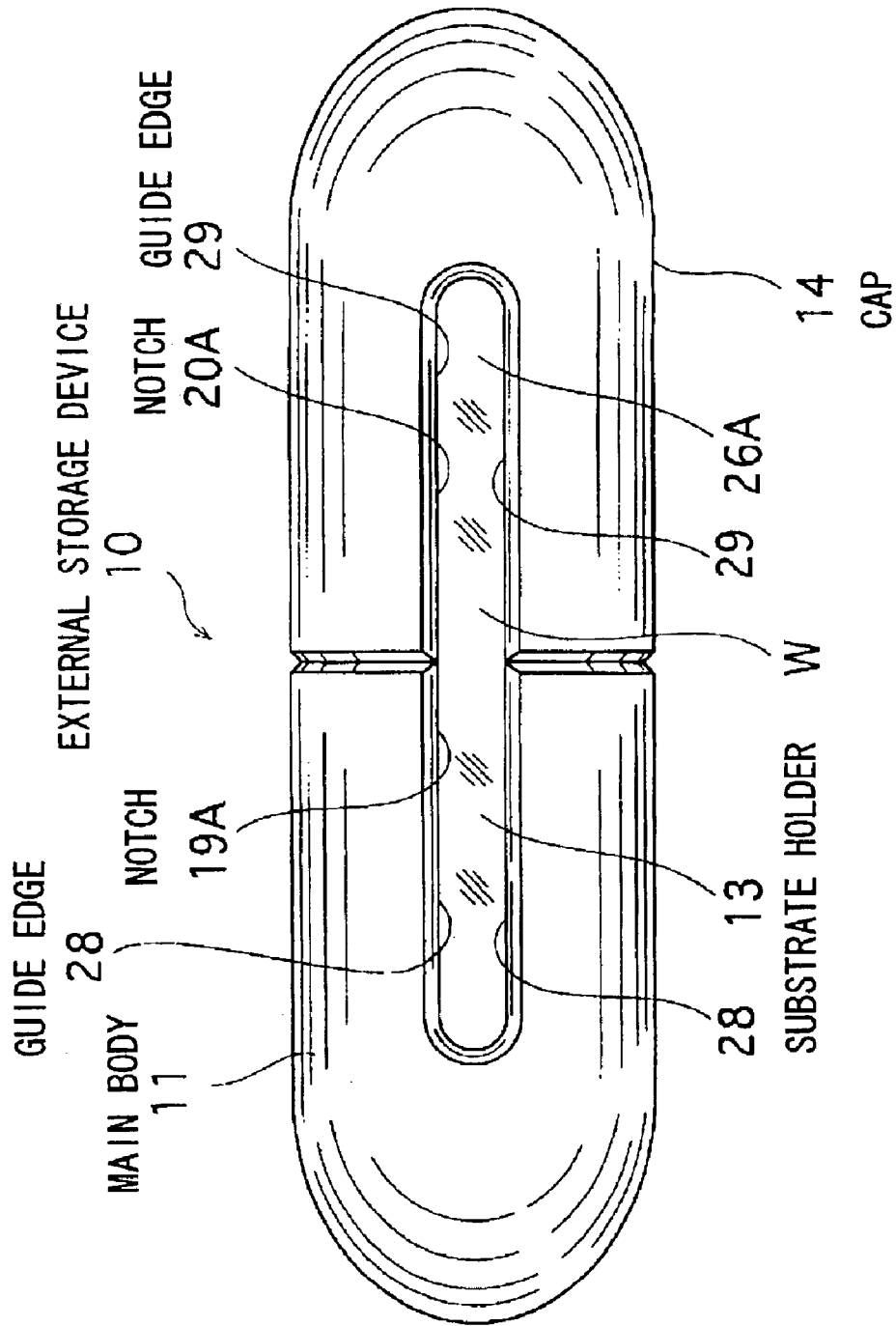
FIG. 2 a plan view showing the entire external storage device according to the embodiment of the present invention.
Figure 3:
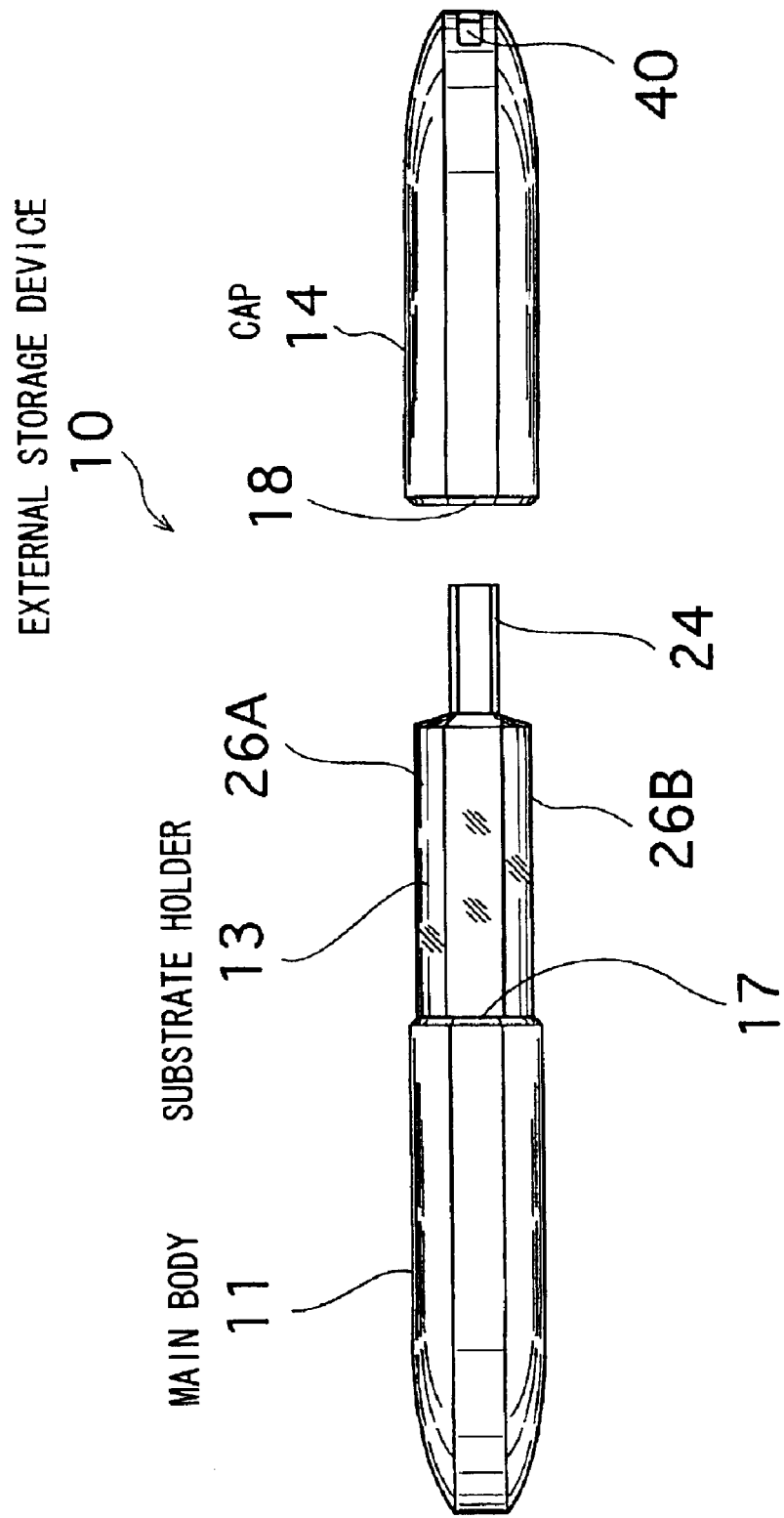
FIG. 3 a side view when a cap is not attached, in the external storage device according to the embodiment of the present invention.

Each of the main body 11 and the cap 14 is formed with an injection-molded body made of a colored opaque resin, for example, a polycarbonate resin, presenting an approximate U-shape as viewed from a plane, as shown in FIG. 2. The respective ends forming the approximate U-shape abut each other to form an almost horizontally symmetry case body as shown in FIGS. 1 and 2.

Figure 8:
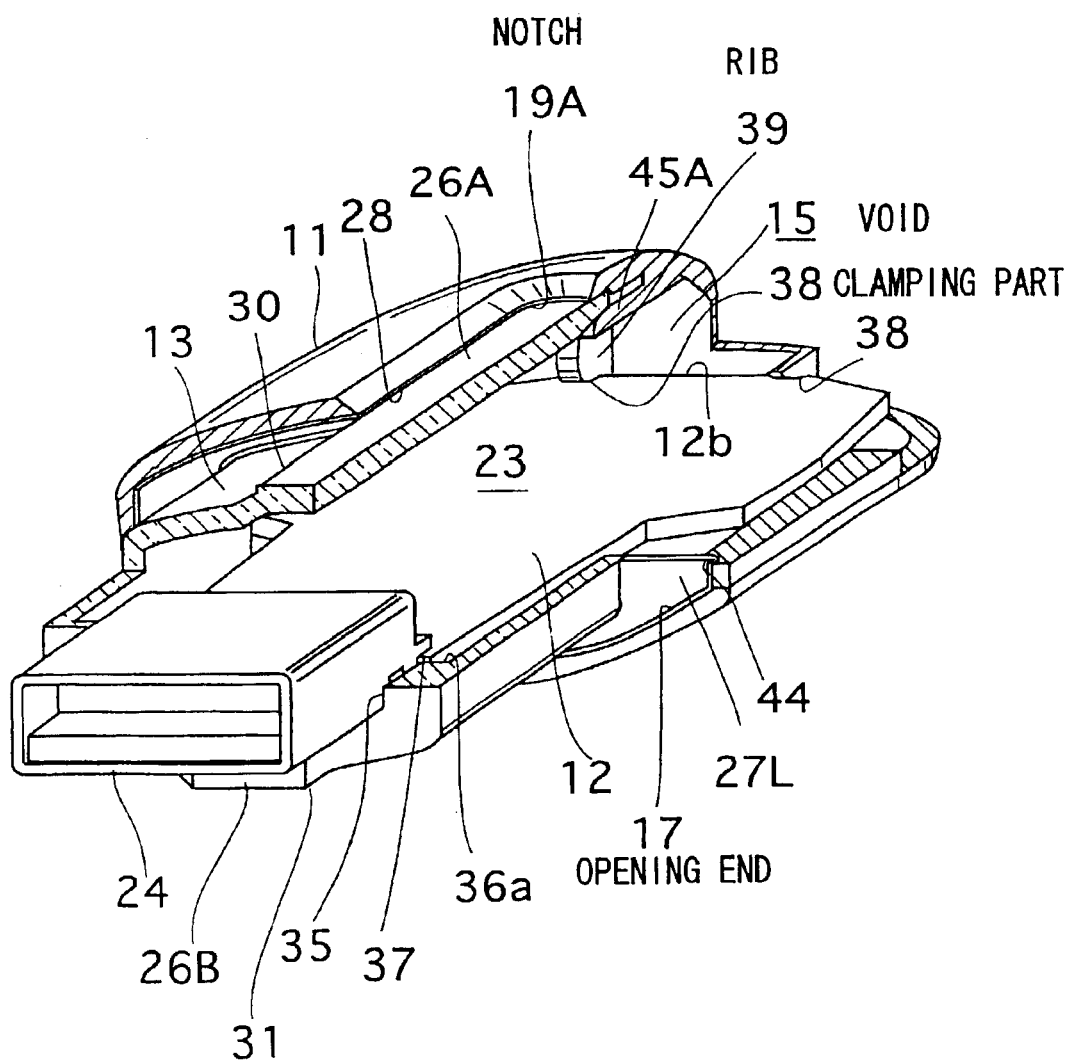
FIG. 8 a partially cutaway perspective view showing the details of the main parts between the memory substrate and the substrate holder, viewed from the side of the cap, in the external storage device according to the embodiment of the present invention.
Figure 10:
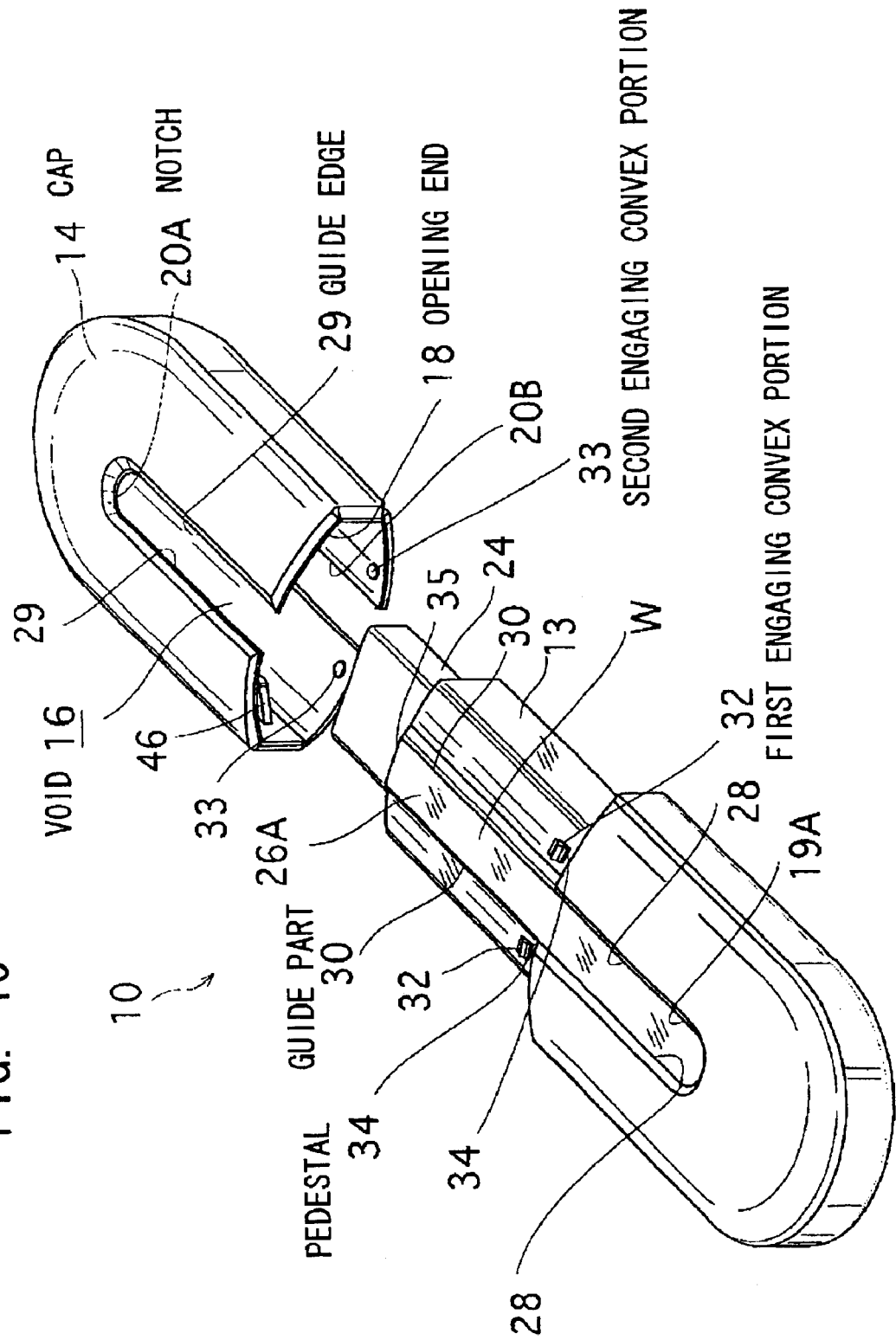
FIG. 10 a perspective view for illustrating attachment/removal operations of the cap to the substrate holder in the external storage device according to the embodiment of the present invention.

The main body 11 and the cap 14 respectively include voids 15 and 16 for housing the substrate holder 13 therein (FIGS. 8 and 10). Each of these voids 15 and 16 presents the shape of a tube with a closed end, which is compressed in a vertical direction in the drawings. The voids are in communication with the exterior through opening ends 17 and 18 and notches 19A, 19B, 20A and 20B formed on upper and lower principal surfaces, respectively. Each of the main body 11 and the cap 14 has an approximate U-shape as viewed from a plane due to these notches 19A, 19B, 20A and 20B.

Figure 5:
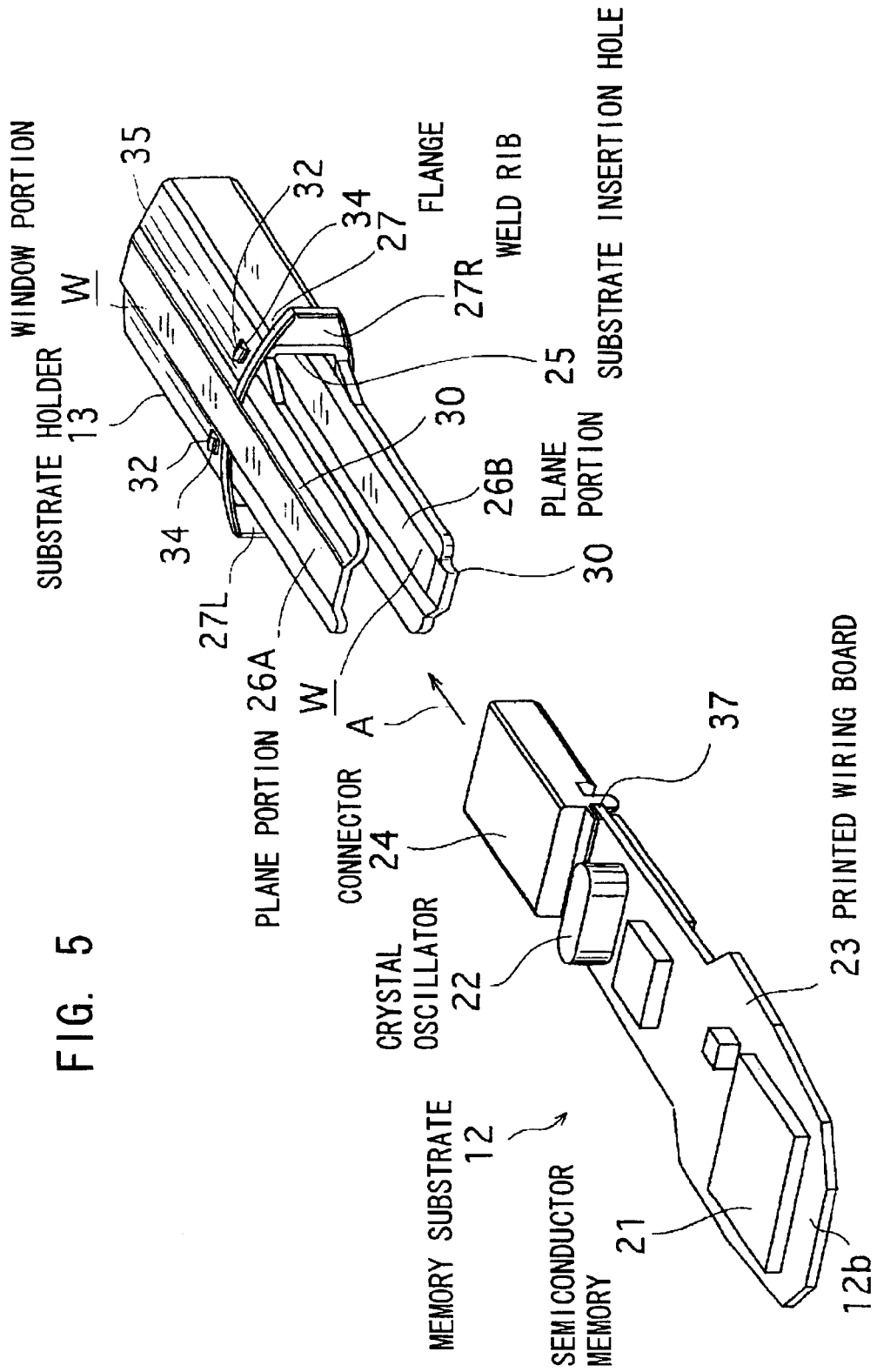
FIG. 5 a perspective view showing the structures of a memory substrate and a substrate holder in the external storage device according to the embodiment of the present invention.

The memory substrate 12 is made of, for example, a glass epoxy type substrate. As shown in FIG. 5, on one face or both faces of a printed-wiring board 23, electronic parts, for example, a semiconductor memory 21 such as a flash memory, and a crystal oscillator 22, are mounted. On an edge of its one end, a connector 24 serving as an external connection terminal is provided. The connector 24 is made of a metal such as stainless for connection with a computer and its peripheral equipment. Inside, a plurality of connection terminals are arranged. In this embodiment, the connector 24 is constituted in conformity to a USB (Universal Serial Bus).

Figure 9:
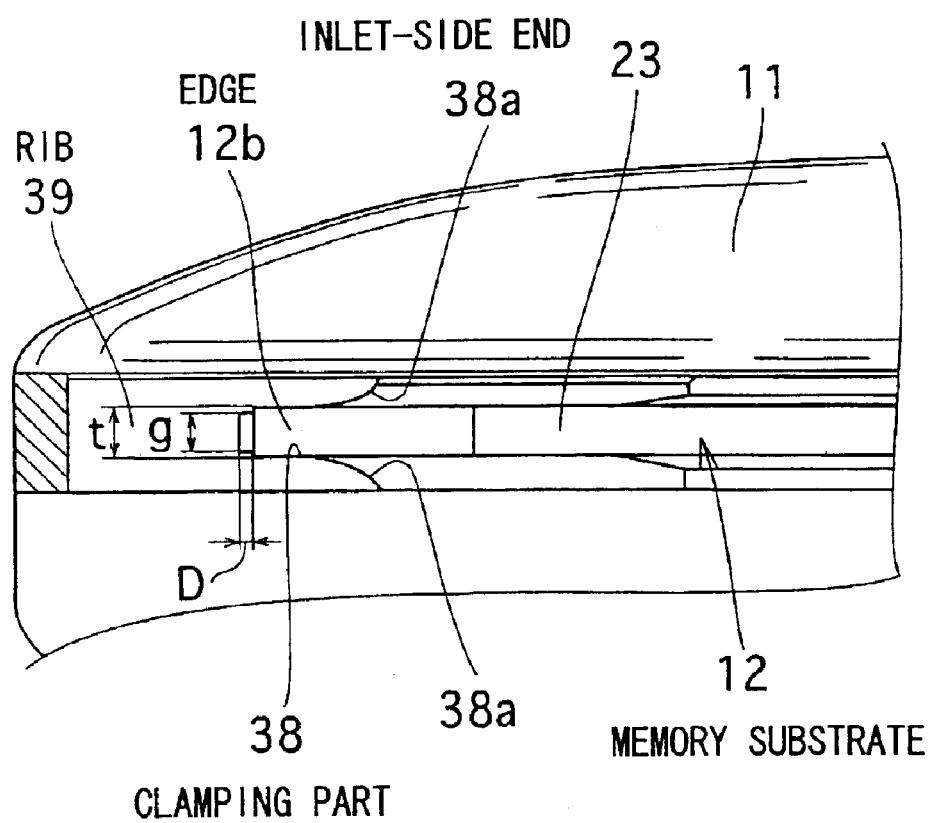
FIG. 9 a partially cutaway side view showing the details of the main parts between the memory substrate and the main body shown in FIG. 8.

The substrate holder 13 is formed with an injection-molded body made of, for example, a colorless transparent polycarbonate resin. In this embodiment, the substrate holder 13 is formed vertically symmetrical in FIG. 5. Inside the substrate holder 13, a substrate insertion hole 25 for inserting the memory substrate 12 therethrough is formed. A total length of the substrate holder 13 is smaller than that of the memory substrate 12 including the connector 24. In a state where the memory substrate 12 is inserted through the substrate insertion hole 25, the connector part 24 of the memory substrate 12 and the end of the printed-wiring board 23 are projected beyond the respective openings of the substrate insertion hole 25 (FIGS. 9 and 10).

In the middle portions of the upper and lower faces of the substrate holder 13, plane portions 26A and 26B are respectively formed along a longitudinal direction as shown in FIG. 5. These plane portions 26A and 26B are partitioned by each of the notches 19A, 19B, 20A and 20B of the main body 11 and the cap 14 in the external storage device 10 according to this embodiment so as to be constituted as window portions W which allows the memory substrate 12 housed therein to be visibly observed from the exterior.

A flange 27 is formed at the periphery of the substrate holder 13 in its middle portion except for the plane portions 26A and 26B so as to divide its total length in two. The flange 27 is formed so that the amount of its projection on both sides is larger than that on the upper and lower faces of the substrate holder 13. These portions on both sides are constituted as weld ribs 27L and 27R, which are rendered integral with the opening end 17 of the main body 11 by ultrasonic welding.

A region of the substrate holder 13 on the cap 14 side (an upper right region in FIG. 5), divided by the flange 27, has such a shape that surrounds the entire periphery of the memory substrate 12 housed therein. On the other hand, a region of the substrate holder 13 on the main body 11 side (a lower left region in FIG. 5) has such a shape that covers only the side of a parts-mounted surface of the memory substrate 12 present inside.

Figure 4:
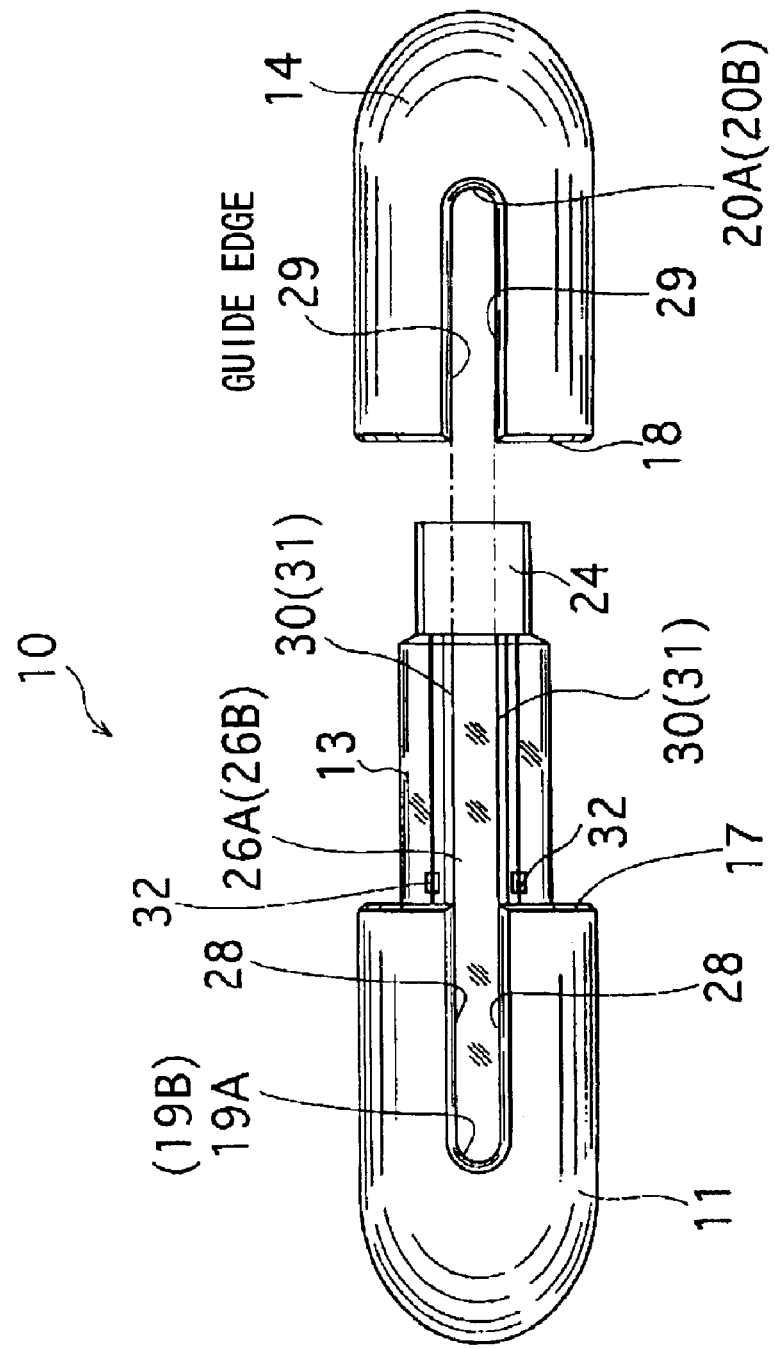
FIG. 4 a plan view when the cap is not attached, in the external storage device according to the embodiment of the present invention.

Next, the notches 19A, 19B, 20A and 20B respectively formed in the main body 11 and the cap 14 include pairs of rectilinear guide edges 28, 28, 29 and 29, which are parallel in an attachment/removal direction of the cap 14 so as to be opposed to each other, for example, as shown in FIG. 4. In attachment of the cap 14, the guide edges 28 and 28 on the main body 11 side and the guide edges 29 and 29 on the cap 14 side are aligned with each other so as to be positioned on the same straight lines, respectively, as shown in FIG. 2.

Figure 11:
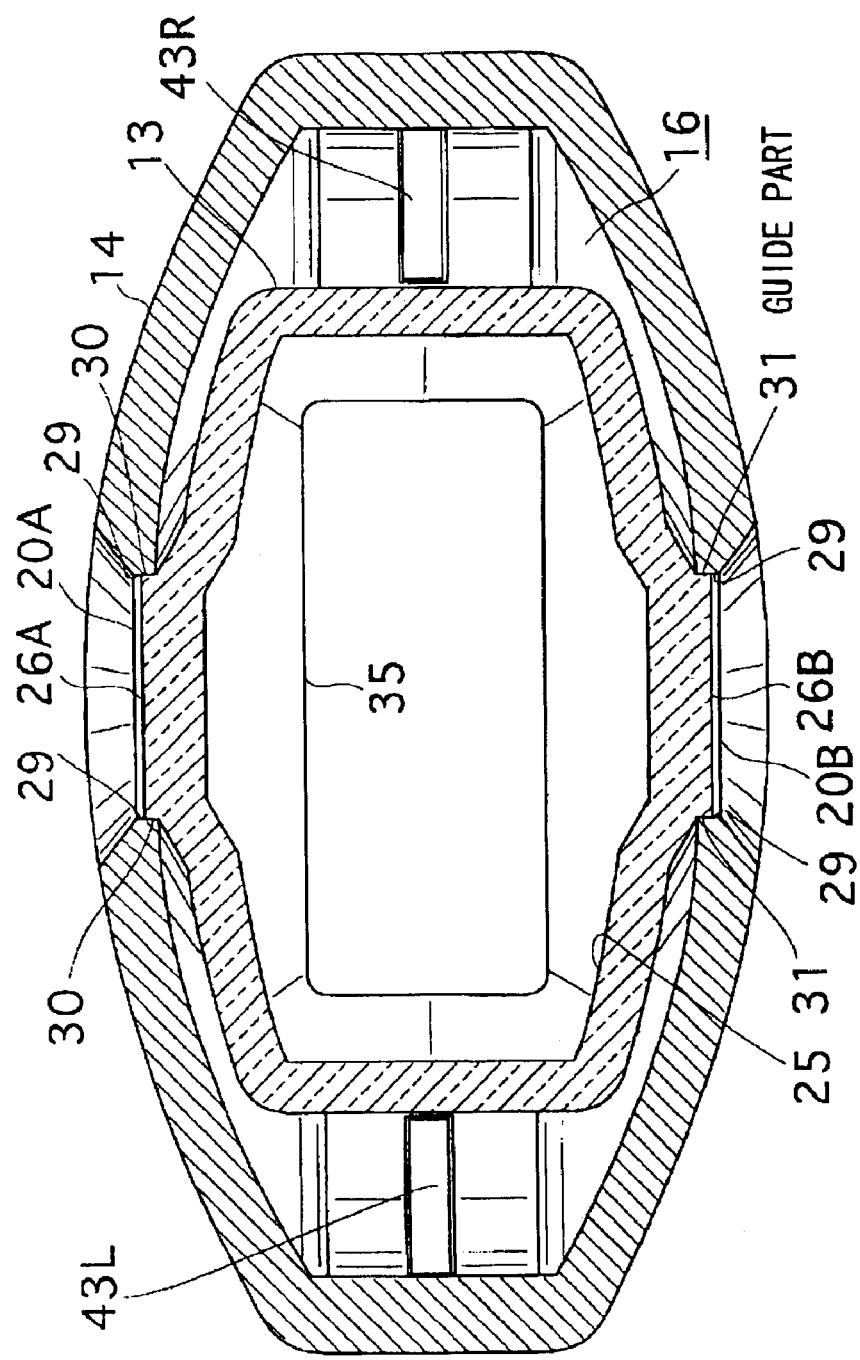
FIG. 11 a cross-sectional view showing the structure inside the cap when the cap is attached, in the external storage device according to the embodiment of the present invention (the illustration of the memory substrate is omitted).

The guide edges 28, 28, 29 and 29 are formed so as to respectively correspond to formation intervals of rectilinear guide parts 30, 30, 31 and 31 corresponding to longer edges of the plane portions 26A and 26B of the substrate holder 13 (FIGS. 4, 10 and 11). As a result, the cap 14 brings the guide edges 29 and 29 in sliding contact with the guide parts 30 and 31 over their almost total length with respect to the substrate holder 13 fixed to the main body 11, thereby obtaining a guiding action for attachment/removal.

Guide lengths of the guide edges 29 and 29 and the guide parts 30 and 31 are formed larger than the amount of projection of the connector 24 with respect to the substrate holder 13. In this embodiment, in particular, the above-mentioned guide lengths are formed to be about double of the amount of projection of the connector 24.

Next, on the outer face of the substrate holder 13 and the inner face of the cap 14, first and second engaging convex portions 32 and 33, which are engaged with each other upon attachment of the cap 14 to the substrate holder 13, are respectively provided at a plurality of positions (FIGS. 10 and 4). In this embodiment, these first and second engaging convex portions 32 and 33 are provided at, in total, four positions (four pairs) so that they are engaged with each other on the upper and lower faces of the substrate holder 13 at the sites symmetrical with respect to the plane portions 26A and 26B.

Figure 14:
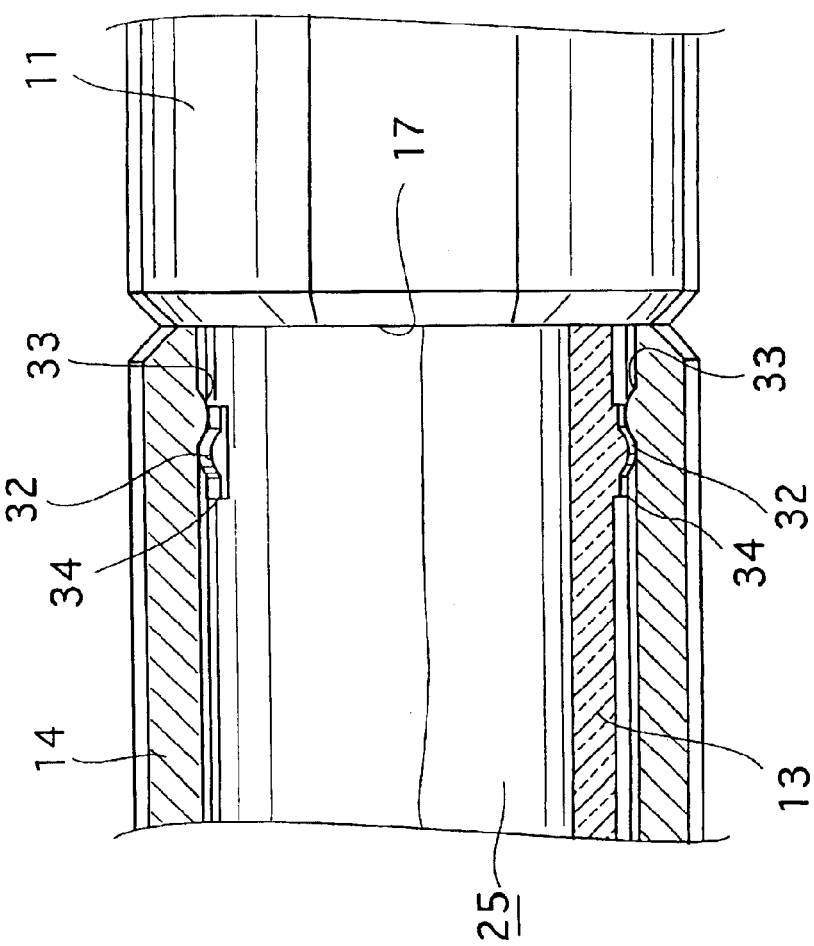
FIG. 14 a partially cutaway side view of the main parts showing the relation between the substrate holder and the cap, in the external storage device according to the embodiment of the present invention.

Among those, the first engaging convex portions 32, which are provided on the outer face of the substrate holder 13, are respectively formed through pedestals 34 (FIGS. 5 and 14). The pedestals 34 present an approximately oblong shape. The pedestal 34 serves to enhance the anti-breakage effects of the engaging convex portion 32 for the substrate holder 13. Moreover, the pedestal 34 is a structure incorporated in advance at the design phase, in consideration of modification of a mold for adjusting the engaged state between the substrate holder 13 and the cap 14, that is, the engagement force of the first and the second engaging convex portions 32 and 33.

Specifically, in a case where a height of one engaging convex portions 32 is increased to enhance the engagement force, it is necessary to more deeply process grooves of a mold for shaping the substrate holder 13, which corresponds to the engaging convex portions 32. As a processing method, for example, a known electric discharge method is employed. In the electric discharge method, however, there may arise a case where not only the grooves but also the peripheral regions of the grooves are processed due to a problem of controllability. At this moment, if the pedestals 34 are formed as in this embodiment, an engraved region in the periphery of the groove corresponding to the pedestal 34 is processed instead of the other outer face forming region upon electric discharge. As a result, the favorable appearance of the outer face of the substrate holder 13, which is a molded body, is prevented from being spoiled.

Next, a positioning mechanism of the memory substrate 12 will be described.

As described above, the memory substrate 12 is inserted through the substrate insertion hole 25 inside the substrate holder 13 in a direction indicated with an arrow A in FIG. 5. At this moment, the connector 24 positioned on the forward end as viewed from an insertion direction of the memory substrate 12 is outwardly projected from an opening 35 on one end of the substrate holder 13 by a predetermined amount of projection as shown in FIG. 10.

Figure 6:
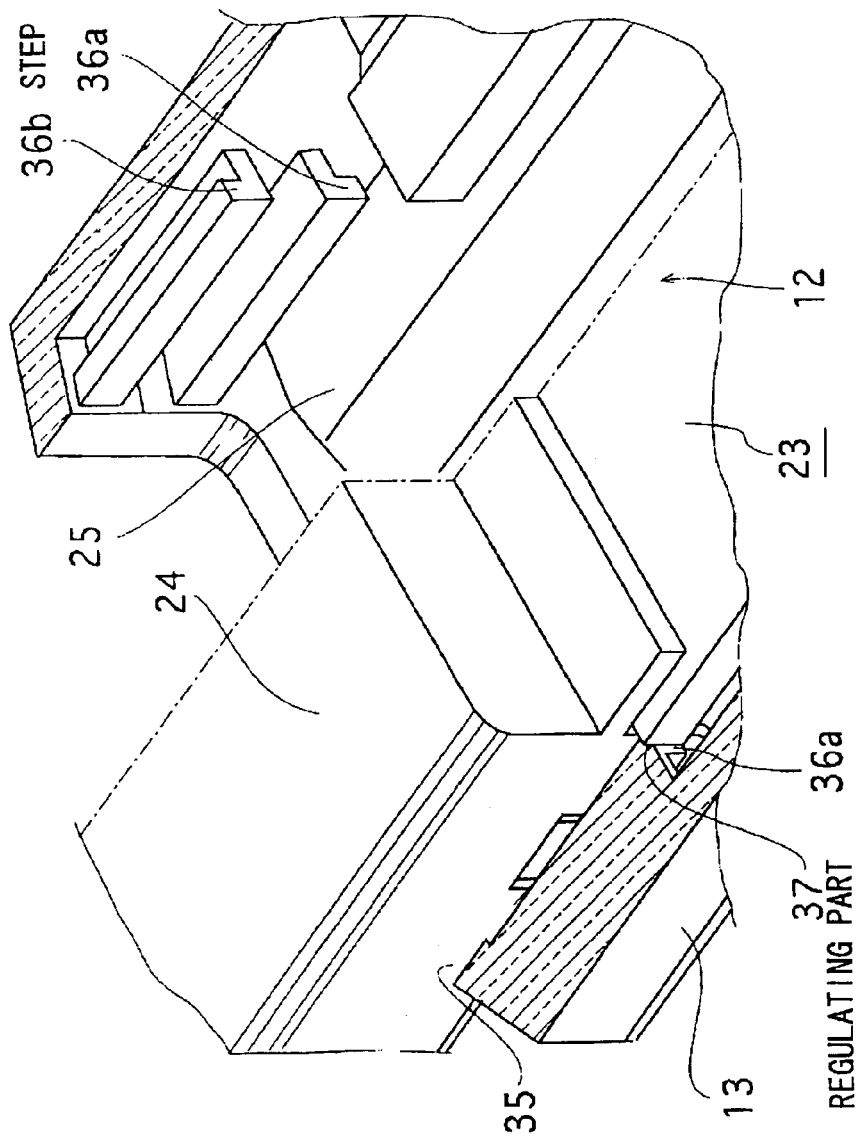
FIG. 6 a partially cutaway perspective view showing the details of main parts between the memory substrate and the substrate holder, viewed from the side of a main body, in the external storage device according to the embodiment of the present invention.
Figure 7:
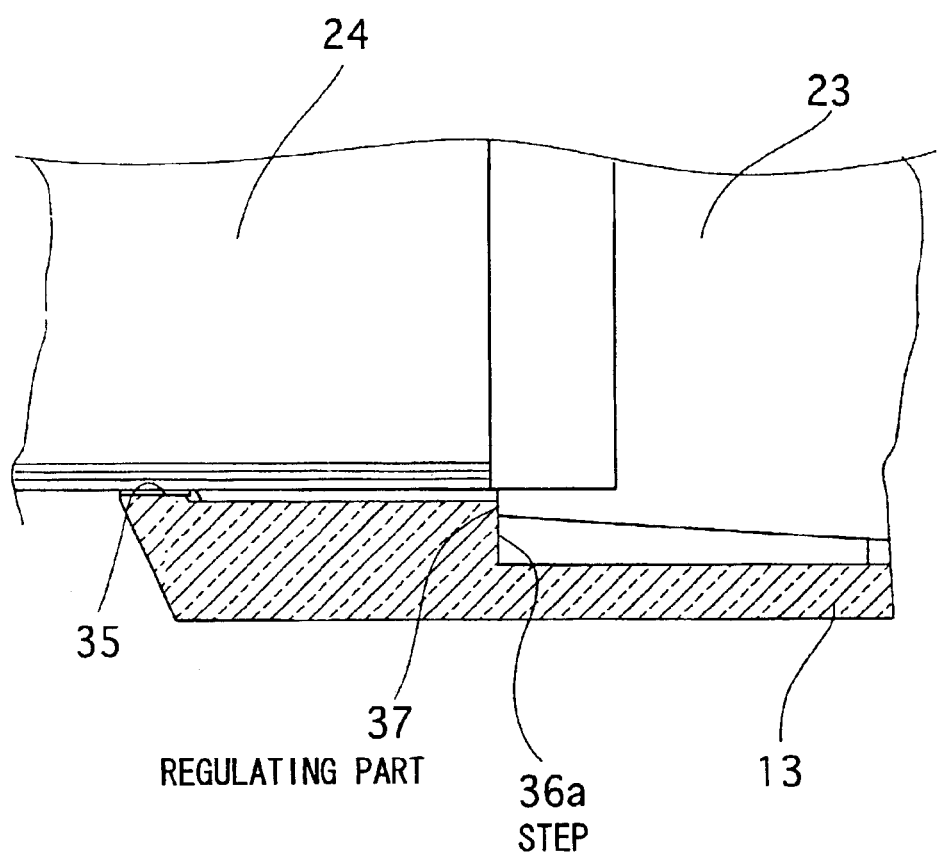
FIG. 7 a plan view showing the main parts shown in FIG. 6.

Therefore, on the outer peripheral part of the memory substrate 12, a regulating part 37 for abutting on steps 36a and 36b formed in the vicinity of the opening 35 inside the substrate insertion hole 25 so as to regulate the amount of projection of the connector 24 from the opening 35 is provided (FIGS. 6, 7 and 8). In this embodiment, the regulating part 37 is formed between the printed-wiring board 23 of the memory substrate 12 and the connector 24.

Each of the steps 36a and 36b presents an approximate L-shape as shown in FIG. 6. The steps are provided in pairs on each inner side wall of the substrate insertion hole 25. As a result, the symmetry is provided for the front and the back of the substrate holder 13, with the intension of improving the assemblability.

More specifically, as shown in FIG. 5, when the memory substrate 12 is inserted while the plane portion 26A of the substrate holder 13 is being upwardly oriented, the regulating part 37 abuts on the steps 36a and 36a so as to regulate the amount of ingression as shown in FIG. 6. On the other hand, when the memory substrate 12 is inserted while the plane portion 26B of the substrate holder 13 is being upwardly oriented, the regulating part 37 abuts on the steps 36b and 36b so as to regulate the amount of ingression.

An approximately L-shaped cross-section of the steps 36a and 36b is for preventing the occurrence of sink generated by shrinkage upon molding of the substrate holder 13.

On the other hand, clamping parts 38 for clamping an edge of the memory substrate 12 are provided at a site opposing an edge on the other end (an edge on the side opposite to the connector 24 side) of the memory substrate 12 inside the main body 11 (FIGS. 8 and 9). Inlet-side ends 38a of the clamping parts 28 are subjected to an R-processing so as to facilitate the ingression of the memory substrate 12.

The clamping parts 38 are formed, for example, as shown in FIG. 9, in a reversed conical shape on ribs 39 which are formed at two positions in an integral manner with the main body 11, and present such a shape that a gap gradually decreases from the inlet-side ends 38a in an ingression direction of the edge 12b of the memory substrate 12. A shape of the clamping parts 38 may be a V-shape, a U-shape, or the like. Any shape can be used as long as the gap gradually decreases from the inlet side ends 38a in an ingression direction of the edge 12b of the memory substrate 12. A predetermined clearance D is formed between a bottom of a groove constituting the clamping parts 38 and the edge 12b of the memory substrate 12 clamped therein (FIG. 9).

Since the memory substrate 12 is formed by a punching process by a press or the like and a shape of a cut surface gradually varies due to an abrasion state of a punch and a die, the dimensional accuracy is poor in many cases. In this embodiment, the dimensional variation of the memory substrate 12 in its longitudinal direction is, for example, about ±0.1 mm. Moreover, the variation in weld depth of the weld ribs 27L and 27R of the substrate holder 13 with respect to the opening end 17 of the main body 11 is, for example, about ±0.05 mm. The main body 2 and the substrate holder 13, which are injection-molded bodies, also have the dimensional variation of, for example, about ±0.05 mm, respectively. Therefore, in total, the dimensional variation of ±0.25 mm or more may be generated. In this embodiment, the dimensional variation is absorbed by the clamping parts 38 having the above-described structure.

More specifically, with reference to FIG. 9, the amount g of the gap on the bottom of the clamping parts 38 formed in a reversed conical shape is formed smaller than a thickness t of the memory substrate 12. As shown in the drawing, the memory substrate 12 is clamped while the clamping parts 38 are being plastically deformed. Even in a case where the memory substrate 12 is affected by the above-mentioned dimensional variation to enter between the clamping parts 38 rather shallowly, the memory substrate 12 plastically deforms the clamping parts 38 so as to be clamped therebetween. When the amount of the clearance D is set at, for example, 0.5 mm in the state without any dimensional variation, it varies between 0.25 mm to 0.75 mm, depending on the amount of dimensional variation.

Figure 13:
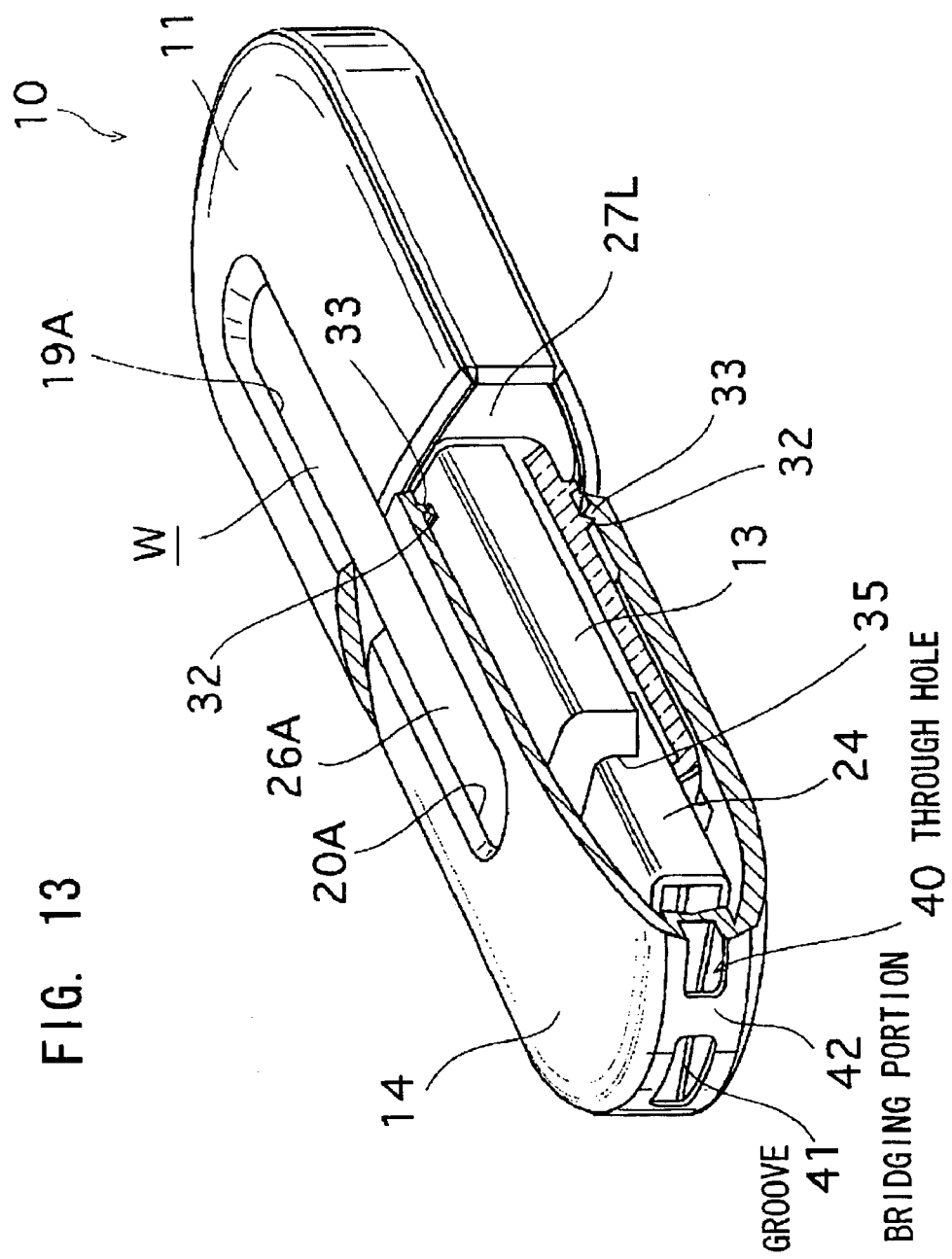
FIG. 13 a partially cutaway perspective view showing the structure inside the cap when the cap is attached, in the external storage device according to the embodiment of the present invention.
Figure 15:
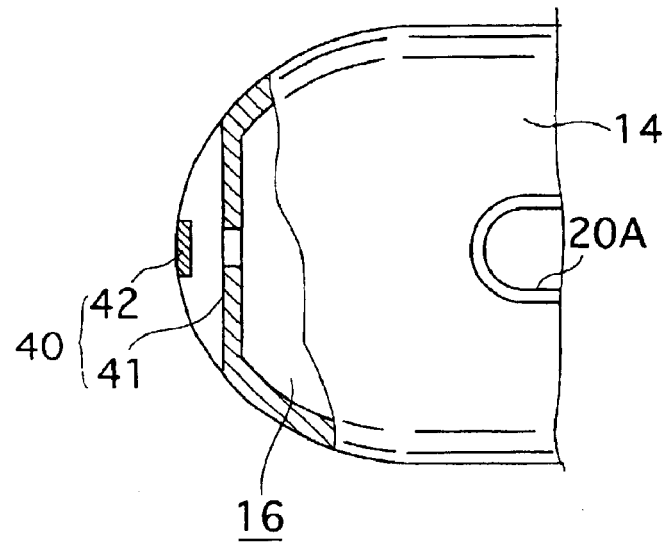
FIG. 15 a cross-sectional view of the main parts of the cap in the external storage device according to the embodiment of the present invention FIG. 16 views showing a structure of a conventional external storage device, where A shows a state that the cap is attached and B shows a state that the cap is unattached.
Figure 16:
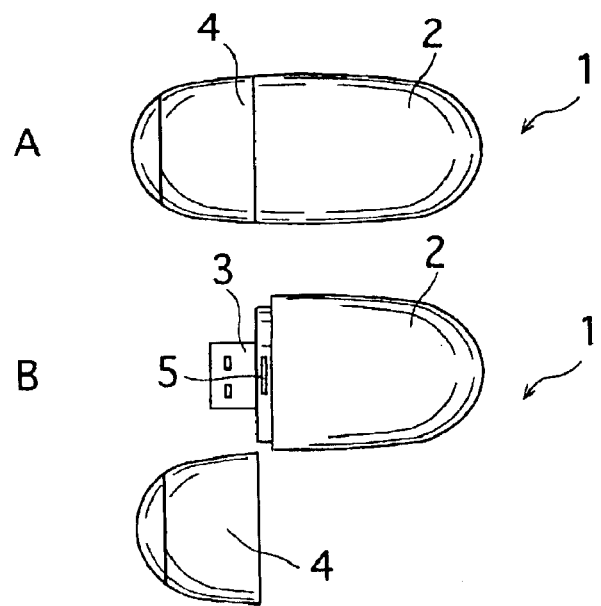

Subsequently, as shown in FIGS. 13 and 15, on the outer periphery of the cap 14, through holes 40 for passing a not-shown strap therethrough are formed. In this embodiment, the through holes 40 are constituted by grooves 41 formed at the tip of the cap 14 and a bridging portion 42 for bridging the grooves 41. Therefore, the above-mentioned strap is connected at the bridging portion 42.

Next, an assembly method of the external storage device 10 of this embodiment constituted as described above will be described.

First, after the memory substrate 12 and the substrate holder 13 are opposed to each other in a direction as shown in FIG. 5, the memory substrate 12 is inserted through the substrate insertion hole 25 of the substrate holder 13. Then, when the connector 24 of the memory substrate 12 passes through the opening 25 of the substrate insertion hole 25 by a predetermined amount, the regulating part 37 of the memory substrate 12 abuts on the steps 36 within the substrate insertion hole 25, thereby regulating further ingression of the memory substrate 12 (FIGS. 6 and 7).

Next, the substrate holder 13 housing the memory substrate 12 therein is inserted into the void 15 inside the main body 10 through a sliding contact action between the guide edges 28 and 28 of the main body 11 and the guide parts 30 and 31 of the substrate holder 13 as shown in FIG. 8. Then, the weld ribs 27L and 27R of the substrate holder 13 and a weld reference plane 44 provided on the opening end 17 of the main body 11 are welded to each other through ultrasonic welding so as to integrate the main body 11 and the substrate holder 13 with each other.

At this moment, the edge 12b on the other end side of the memory substrate 12 is clamped by the clamping parts 38 and 38 provided inside the main body 11 (FIGS. 8 and 9). The clamping parts 38 and 38 present an approximate V-shape. Therefore, even if variation in the amount of ingression (dimensional variation in the printed-wiring board 23 itself, variation in the ultrasonic welding conditions and the like) is generated for the memory substrate 12, the variation is absorbed as a final result, only with a difference in the degree of plastic deformation of the clamping parts 38 and 38. As a result, the memory substrate 12 is certainly positioned between the steps 36 of the substrate insertion hole 25 of the substrate holder 13 and the clamping parts 38 and 38 inside the main body 11.

As a result, the generation of clattering noise caused by the memory substrate 12 when the external storage device 10 is carried can be prevented, thereby eliminating the feeling of insecurity in terms of functions and the uncomfortablility from a user. Moreover, a jointing material (solder) for the parts mounted on the substrate is prevented from being stripped off due to vibration upon welding, and the semiconductor memory 21 and the crystal oscillator 22, which are precision electronic parts, can be prevented from being damaged. Thus, the accurate recording and storage functions of various data or sounds/images can be ensured.

Simultaneously with the clamping action of the clamping parts 38 and 38 for the edge 12b of the memory substrate 12, edges of the plane portions 26A and 26B of the substrate holder 13 on the main body 11 side are held by holding parts 45A and 45B formed on edges of the ends of the notches 19A and 19B of the main body 11 (in FIG. 8, only the holding part 45A is shown). Each of opposed faces of the notches 19A and 19B with respect to the holding parts 45A and 45B presents a tapered shape, so that the holding parts 45A and 45B are elastically deformed in accordance with the amount of ingression of the notches 19A and 19B to elastically support the notches 19A and 19B.

Next, as shown in FIG. 10, the main body 11 integrated with the substrate holder 13 and the cap 14 are opposed to each other. In order to attach the cap 14 to the substrate holder 13, the guide edges 29 and 29 of the cap 14 are fitted into the guide parts 30 and 31 of the substrate holder 13. The substrate holder 13 is housed within the void 16 of the cap 14 through the sliding contact action therebetween.

Figure 12:
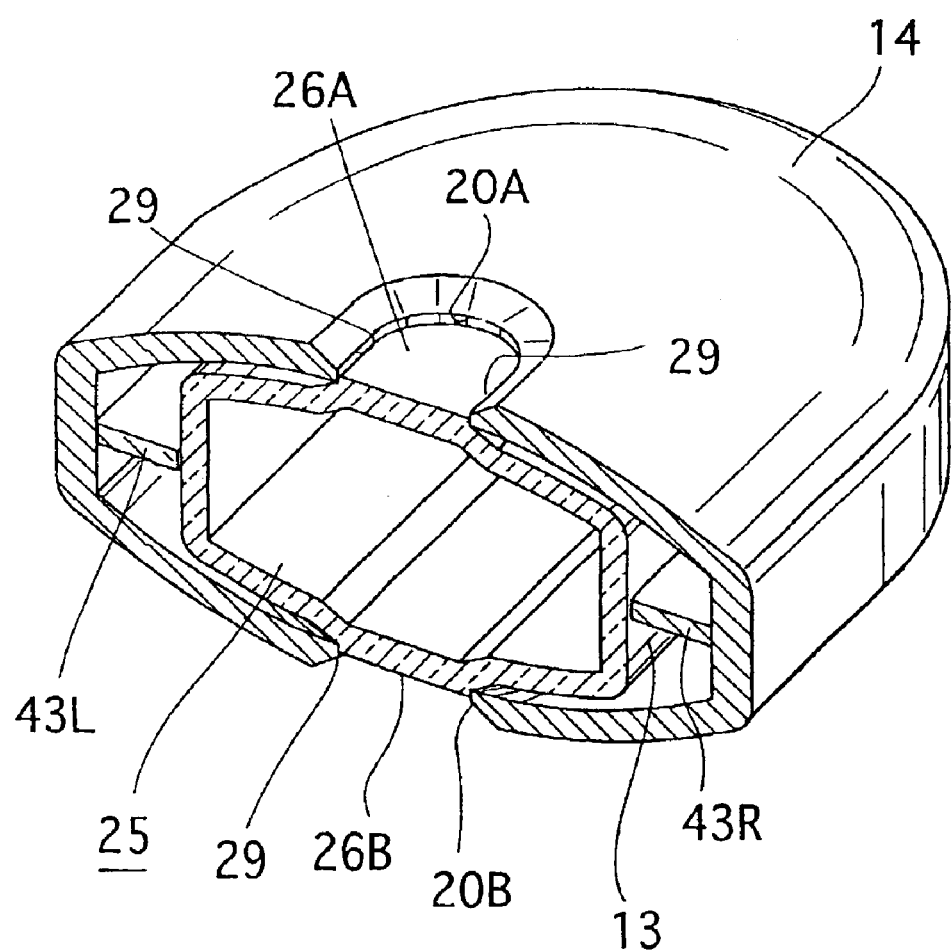
FIG. 12 a perspective view of the main parts shown in FIG. 11.

At this time, in a case where more than a predetermined shift is generated between an axial core position of the main body 11 and an axial core position of the cap 14, guide ribs 43L and 43R formed on the inner faces of the side walls of the cap 14 in a protruding manner abut on the substrate holder 13 so as to effect the action of aligning the axial core position of the main body 11 and the axial core position of the cap 14 with each other (FIGS. 11 and 12). In this embodiment, ends 46 and 46 of the guiding ribs 43L and 43R on the ingression side are tapered so as to prevent the attachment operability of the cap 14 from being impaired (FIG. 10).

When a slide length of the cap 14 with respect to the substrate holder 13 reaches a predetermined amount, the first and the second engaging convex portions 32 and 33 are engaged with each other. More specifically, the first engaging convex portions 32 on the substrate holder 13 side pass over the second engaging convex portions 33 so as to outwardly push the cap 14, whereby the first and the second engaging convex portions 32 and 33 are engaged with each other as shown in FIG. 14. As a result, the attachment action of the cap 14 to the substrate holder 13 is completed. At the same time, the window portions W and W allowing the memory substrate 12 present inside to be externally visibly observed are formed (FIGS. 1, 2 and 13).

As described above, according to the external storage device 10 of this embodiment, the memory substrate 12 present inside the device can be visibly observed from the exterior through the window portions W and W. Therefore, the shape of the outer appearance can be such that a user is fully conscious of the handling of the external storage device 10 as precision electronic equipment, regardless of attachment/unattachment of the cap 14. As a result, it is possible to call user's attention to the handling so as not to carelessly keep the external storage device under a circumstance subject to high temperature and high humidity or not to apply a strong shock.

In addition, since the memory substrate 12 can be visibly observed from the exterior, it is possible to select the type of the external storage device 10 in accordance with the kind of the memory substrate 12 to be included therein. More specifically, in view of business practice, the model number of a product is frequently varied based on a storage capacitance (16 MB, 32 MB or the like) of the semiconductor memory 21 to be included. In addition, these capacitance or model number can be printed on the substrate or the semiconductor part, which is visibly observable from the exterior through the window portions W and W, so that a user can visibly confirm them.

Moreover, according to the above-described embodiment, the cap 14 includes the pair of guide edges 29 and 29 which are parallel in its attachment/removal direction so as to be opposed to each other, whereas the substrate holder 13 is provided with the rectilinear guide parts 30 and 30 which are in sliding contact with the pair of guide edges 29 and 29 over its almost total length so as to guide the attachment/removal of the cap 14. Therefore, the attachment of the cap 14 is made concomitant with its slide operation for the substrate holder 13 over a predetermined length so as to certainly guide the cap 14 at an appropriate attachment position.

In this embodiment, in particular, a guide length by the guide edges 29 or the guide parts 30 is formed long so as to be about double of the amount of projection of the connector 24 from the substrate holder 13. Therefore, the above-described effects are made further remarkable.

Furthermore, owing to the engaging action by the first and the second engaging convex portions 32 and 33, a moderate click effect for telling the completion of attachment of the cap 14 is obtained. Thus, an incomplete cap attachment action can be avoided. As a result, the cap can be prevented from coming off or being lost.

Moreover, in the attachment state of the cap 14, in addition to the engaging action by the first and the second engaging convex portions 32 and 33, an abutting action between the guide edges 29 and 29 and the guide parts 30 and 31 is simultaneously obtained. As a result, the engagement force between the engaging convex portions 32 and 33 is relatively enhanced so as to prevent the cap 14 from being easily removed from the substrate holder 13 even if a shock is carelessly applied to the cap 14.

Moreover, owing to a cooperating action of the guide edges 29 and 29 and the guide parts 30 and 31, the sealability at a boundary region between the substrate holder 13 and the cap 14 can be enhanced to improve the function for protecting the connector 24 against dusts or the like.

Although the embodiment of the present invention has been described above, it is apparent that the present invention is not limited thereto; various changes are possible based on the technical idea of the present invention.

For example, although the window portions W and W are formed by forming the notches 19A, 19B, 20A and 20B respectively for the main body 11 and the cap 14 in this embodiment, it is apparent that they are not limited thereto. It is sufficient to merely form the notches in either the main body 11 or the cap 14. A structure of the notches 19A, 19B, 20A and 20B formed in the main body 11 and the cap 14 is not limited to that of the notches formed on their upper and bottom faces; the notches may be formed only on either one faces.

Moreover, although the size of the window portions W and W can be appropriately adjusted, the state where the electronic parts such as a semiconductor memory are mounted can be visibly observed from the exterior as long as the area of the window portions corresponds to 20% or more of the total area of the printed-wiring board 23 to be housed. Therefore, the similar effects to those of the above-described embodiment can be obtained.

Furthermore, in the above-described embodiment, the memory substrate 12 is supported while the clamping-parts 38 constituted as a positioning mechanism for the memory substrate 12 are being plastically deformed in accordance with the amount of ingression of the memory substrate 12. Instead, an elastic coating film such as a rubber may be formed on the inner faces of the clamping parts 38 so that the memory substrate 12 is supported while the elastic coating film is being elastically deformed.

Alternatively, one wall of the groove constituting the clamping parts 38 may be constituted so as to be elastically deformable, for example, as the holding part 45A formed on the edge of the end of the notch 19A of the main body 11 shown in FIG. 8, thereby elastically supporting the memory substrate 12.

Furthermore, although the substrate holder 13 is constituted to be colorless and transparent it the above-described embodiment, it can be constituted to be colored and transparent, for example, red transparent or yellow transparent. In this case, the color of the substrate holder 13 may be changed in accordance with the storage capacitance of the semiconductor memory 21.

[Effects of the Invention]

As described above, according to the external storage device of the present invention, the notches for externally exposing the transparent substrate holder are provided for the main body and/or the cap, so that the memory substrate present inside is visibly observed from the exterior through the window portions formed by the notches. Therefore, the shape of the outer appearance can be such that a user is fully conscious of the handling as precision electronic equipment, regardless of attachment/unattachment of the cap. As a result, it is possible to call user's attention to the handling so as not to carelessly keep the external storage device under a circumstance subject to high temperature and high humidity or not to apply a strong shock.

Moreover, the notches formed in the cap include a pair of the guide edges which are parallel in its attachment/removal direction to the substrate holder so as to oppose to each other, whereas the substrate holder is provided with the rectilinear guide parts which are in sliding contact with the pair of guide edges over its almost total length so as to guide the attachment/removal of the cap. Therefore, the cap attachment operation can be made appropriate. At the same time, the cap can be restrained from coming off to prevent the cap from being lost.

[Description of the Reference Numerals]

10: external storage device; 11: main body; 12: memory substrate; 13: substrate holder; 14: cap; 19A, 19B, 20A and 20B: notches; 21: semiconductor memory; 23: printed-wiring board; 24: connector (external connection terminal); 25: substrate insertion hole; 28 and 29: guide edges; 30 and 31: guide parts; 32: first engaging convex portion; 33: second engaging convex portion; 34: pedestal; 35: opening on one end of substrate holder; 36: step inside substrate insertion hole; 37: regulating part; 38: clamping part; 40: through hole; W: window portion

What is claimed is:

1. An external storage device housing a semiconductor memory therein, characterized by comprising:

a main body;

a memory substrate on which at least the semiconductor memory is mounted, said memory substrate being provided with an external connection terminal on an edge of its one end;

a substrate holder including a substrate insertion hole therein through which said memory substrate is inserted, said substrate holder being for fixing said memory substrate to said main body while said external connection terminal is being outwardly projected beyond an opening on one end of said substrate insertion hole; and a cap for protecting said external connection terminal, said cap being attachable/removable to/from said substrate holder, wherein said substrate holder is made of a transparent material;

at least one notch for externally exposing said substrate holder is formed in said main body and/or said cap; and said memory substrate is visibly observable from exterior through said notch and said transparent substrate holder.

2. The external storage device according to claim 1, characterized in that:

said notch formed in said cap includes a pair of guide edges, said guide edges being parallel in an attachment/removal direction of said cap to said substrate holder so as to oppose to each other; and said substrate holder is provided with rectilinear guide parts in sliding contact with said pair of guide edges over their almost total length so as to guide attachment/removal of said cap.

3. The external storage device according to claim 1, characterized in that a plurality of first engaging convex portions and a plurality of second engaging convex portions are respectively provided on an outer face of said substrate holder and an inner face of said cap, said first and said second engaging convex portions being engaged with each other when said cap is attached to said substrate holder.

4. The external storage device according to claim 3, characterized in that said engaging convex portions provided on said outer face of said substrate holder are formed through pedestals.

5. The external storage device according to claim 1, characterized in that a regulating part for abutting on a step within said substrate insertion hole so as to regulate the amount of projection of said external connection terminal from said opening is provided on an outer peripheral part of said memory.

6. The external storage device according to claim 1, characterized in that clamping parts for clamping an edge of the other end of said memory substrate are provided at a site opposed to said edge of said other end, inside said main body.

7. The external storage device according to claim 6, characterized in that said clamping parts support said memory substrate in concomitant with plastic deformation caused due to ingression of said memory substrate.

* * * * *

UNITED STATES PATENT AND TRADEMARK OFFICE
CERTIFICATE OF CORRECTION

PATENT NO.    : 6,924,996 B2
DATED         : August 2, 2005
INVENTOR(S)   : Norio Sugawara It is certified that error appears in the above-identified patent and that said Letters Patent is hereby corrected as shown below:

Title page,
Item [54], Title, change "EXTERNAL STORAGE DEVICE WHICH IS REPLACEABLE OR PORTABLE AS AN EXERNAL STORAGE MEDIUM FOR A PERSONAL COMPUTER OF THE LIKE" to
-- EXTERNAL STORAGE DEVICE WHICH IS REPLACEABLE OR PORTABLE AS AN EXTERNAL STORAGE MEDIUM FOR A PERSONAL COMPUTER OR THE LIKE --.

Signed and Sealed this

Thirteenth Day of September, 2005

JON W. DUDAS
*Director of the United States Patent and Trademark Office*